(12) United States Patent
Liu et al.

(10) Patent No.: US 10,192,991 B2
(45) Date of Patent: Jan. 29, 2019

(54) THIN FILM TRANSISTOR AND MANUFACTURING METHOD THEREOF, ARRAY SUBSTRATE AND DISPLAY DEVICE

(71) Applicant: BOE Technology Group Co., Ltd., Beijing (CN)

(72) Inventors: Wei Liu, Beijing (CN); Jingang Fang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/571,553

(22) PCT Filed: May 5, 2017

(86) PCT No.: PCT/CN2017/083197
§ 371 (c)(1),
(2) Date: Nov. 3, 2017

(87) PCT Pub. No.: WO2018/040608
PCT Pub. Date: Mar. 8, 2018

(65) Prior Publication Data
US 2018/0308984 A1   Oct. 25, 2018

(30) Foreign Application Priority Data
Aug. 31, 2016  (CN) .......................... 2016 1 0798600

(51) Int. Cl.
*H01L 29/786* (2006.01)
*H01L 27/12* (2006.01)
(Continued)

(52) U.S. Cl.
CPC ...... *H01L 29/78618* (2013.01); *G02F 1/1368* (2013.01); *G02F 1/133514* (2013.01);
(Continued)

(58) Field of Classification Search
None
See application file for complete search history.

(56) References Cited

U.S. PATENT DOCUMENTS

| 2011/0101333 A1* | 5/2011 | Shionoiri | H01L 21/76254 257/43 |
| 2014/0167035 A1 | 6/2014 | Yang et al. | |
| 2018/0069034 A1* | 3/2018 | He | G02F 1/133514 |

FOREIGN PATENT DOCUMENTS

| CN | 103021942 A | 4/2013 |
| CN | 105097948 A | 11/2015 |

(Continued)

OTHER PUBLICATIONS

Aug. 7, 2017—(WO) International Search Report and Written Opinion Appn PCT/CN2017/083197 with English Tran.

*Primary Examiner* — Minh-Loan Tran
(74) *Attorney, Agent, or Firm* — Banner & Witcoff, Ltd.

(57) ABSTRACT

A thin film transistor and a manufacturing method thereof, an array substrate and a display device. The manufacturing method of the thin film transistor includes: providing a substrate; depositing an active layer film, a gate insulator layer film, and a gate metal layer film on the substrate in sequence, patterning the active layer film, the gate insulator layer film, and the gate metal layer film to form an active layer, a gate insulator layer and a gate metal layer respectively, and depositing an insulator layer film at a first temperature and patterning the insulator layer film to form an insulator layer; a portion of the active layer, which portion is not overlapped with the gate metal layer, is treated to become conductive to provide a conductor during deposition of the insulator layer film.

18 Claims, 4 Drawing Sheets

(51) Int. Cl.
  *H01L 21/02*    (2006.01)
  *H01L 21/383*   (2006.01)
  *H01L 29/24*    (2006.01)
  *G02F 1/1368*   (2006.01)
  *G02F 1/167*    (2006.01)
  *G02F 1/1335*   (2006.01)
  *H01L 29/66*    (2006.01)
  *H01L 27/32*    (2006.01)

(52) U.S. Cl.
  CPC ........ *G02F 1/167* (2013.01); *H01L 21/02488* (2013.01); *H01L 21/02565* (2013.01); *H01L 21/383* (2013.01); *H01L 27/127* (2013.01); *H01L 27/1222* (2013.01); *H01L 27/1225* (2013.01); *H01L 27/1251* (2013.01); *H01L 29/24* (2013.01); *H01L 29/66969* (2013.01); *H01L 29/7869* (2013.01); *G02F 2201/123* (2013.01); *H01L 27/3262* (2013.01)

(56) References Cited

FOREIGN PATENT DOCUMENTS

| | | |
|---|---|---|
| CN | 105529366 A | 4/2016 |
| CN | 106129122 A | 11/2016 |

\* cited by examiner

THIN FILM TRANSISTOR AND MANUFACTURING METHOD THEREOF, ARRAY SUBSTRATE AND DISPLAY DEVICE

The application is a U.S. National Phase Entry of International Application No. PCT/CN2017/083197 filed on May 5, 2017, designating the United States of America and claiming priority to Chinese Patent Application No. 201610798600.6, filed Aug. 31, 2016. The present application claims priority to and the benefit of the above-identified applications and the above-identified applications are incorporated by reference herein in their entirety.

TECHNICAL FIELD

Embodiments of the present invention relate to a thin film transistor, a manufacturing method thereof, an array substrate and a display device.

BACKGROUND

Thin film transistors have advantages such as high mobility, good stability, simplicity of manufacturing process and so on. Oxide semiconductor materials, represented by indium gallium zinc oxide (IGZO), are widely applied in fields such as thin film transistor liquid crystal displays (TFT-LCDs), active matrix organic light-emitting diodes displays (AMOLEDs), e-paper displays, integrated circuits and so on.

Capacitance generated between the gate electrode and the source electrode of an oxide thin film transistor is small so as to make a display panel have advantages such as high resolution, low power consumption and the like. Top-gate oxide thin film transistors play an essential role in large-sized displays and can greatly enhance the electrical performance of thin film transistors, such as stability and uniformity of thin film transistors.

SUMMARY

At least one embodiment of the present invention provides a manufacturing method of a thin film transistor, comprising: providing a substrate; depositing an active layer film, a gate insulator layer film, and a gate metal layer film on the substrate in sequence, and patterning the active layer film, the gate insulator layer film, and the gate metal layer film to form an active layer, a gate insulator layer and a gate metal layer respectively; and depositing an insulator layer film at a first temperature and patterning the insulator layer film to form an insulator layer; a portion of the active layer, which portion is not overlapped with the gate metal layer, is treated to become conductive to provide a conductor during deposition of the insulator layer film For example, the manufacturing method provided by at least one embodiment of the present invention further comprises: depositing a source-drain electrode layer film, and patterning the source-drain electrode layer film to form a source-drain electrode layer.

For example, the manufacturing method provided by at least one embodiment of the present invention further comprises: forming via holes in the insulator layer, wherein the portion of the active layer, which portion has been made conductive, is electrically connected with the source-drain electrode layer through the via holes.

For example, the manufacturing method provided by at least one embodiment of the present invention further comprises: forming a buffer layer between the substrate and the active layer.

For example, in the manufacturing method provided by at least one embodiment of the present invention, a material of the active layer includes indium gallium zinc oxide (IGZO), indium zinc oxide (IZO), zinc oxide (ZnO) or gallium zinc oxide (GZO).

For example, in the manufacturing method provided by at least one embodiment of the present invention, the first temperature is 290° C. or above.

For example, in the manufacturing method provided by at least one embodiment of the present invention, the first temperature is in a range of 290° C.-400° C.

For example, the manufacturing method provided by at least one embodiment of the present invention further comprises: performing a plasma treatment to the portion of the active layer, which portion of the active layer is not overlapped with the gate metal layer.

At least one embodiment of the present invention further provides an oxide thin film transistor, comprising: a substrate; an active layer, a gate insulator layer, a gate metal layer, an insulator layer, and a source-drain electrode layer provided on the substrate in sequence; a conductor is provided on a surface of a portion of the active layer, which portion of the active layer is not overlapped with the gate metal layer in a direction perpendicular to the substrate, and the conductor is formed during deposition of the insulator layer at a first temperature, and the conductor is electrically connected to the source-drain electrode layer.

For example, in the thin film transistor provided by at least one embodiment of the present invention, the first temperature is 290° C. or above.

For example, in the thin film transistor provided by at least one embodiment of the present invention, the first temperature is in a range of 290° C.-400° C.

For example, in the thin film transistor provided by at least one embodiment of the present invention, the conductor is formed by plasma treatment.

For example, in the thin film transistor provided by at least one embodiment of the present invention, a gas for generating plasma includes nitrogen, argon or helium.

For example, in the thin film transistor provided by at least one embodiment of the present invention, a material of the active layer includes indium gallium zinc oxide (IGZO), indium zinc oxide (IZO), zinc oxide (ZnO) and gallium zinc oxide (GZO).

For example, the thin film transistor provided by at least one embodiment of the present invention further comprises a buffer layer between the substrate and the active layer.

For example, in a thin film transistor provided by at least one embodiment of the present invention, a material of the buffer layer includes silicon oxide or silicon nitride.

At least one embodiment of the present invention further provides an array substrate comprising any one of thin film transistors described above.

At least one embodiment of the present invention further provides a display device comprising any array substrate described above.

BRIEF DESCRIPTION OF THE DRAWINGS

FIG. 3 is a schematic structural view of an array substrate provided by an embodiment of the present invention;

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

During a manufacturing process of a top-gate oxide thin film transistor, a source region and a drain region of an oxide active layer are treated to become conductive in order to make the switching characteristics of the thin film transistor better. A common treatment to make the source region and the drain region conductive comprises performing plasma bombardment onto the surface of the active layer and modify the surface structure of the active layer, so as to enhance its conductivity. However, in the following step of depositing a insulator layer film, a relatively low temperature is applied to form a silicon oxide film or a silicon nitride film; because of the low temperature, the film quality of the resultant silicon oxide film or silicon nitride film is poor. Furthermore, further modification in the surface structure of the active layer, for example, loss of oxygen element which can enhance the electrical property, do not take place because of the low temperature. Therefore, the switching characteristic of the thin film transistor that is obtained finally is not as desirable.

Figure 1:
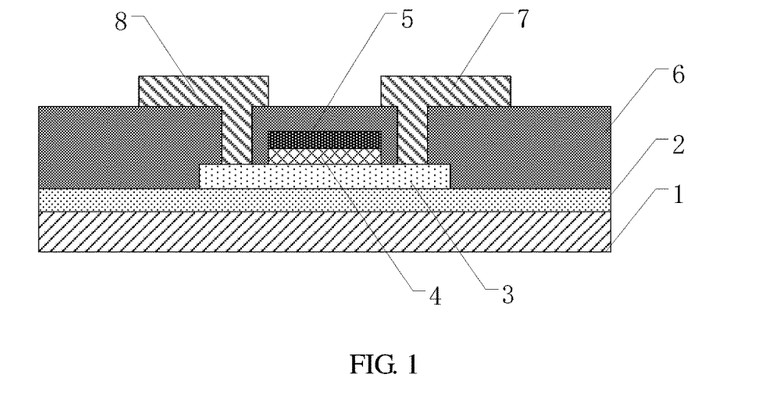
FIG. 1 is a schematic structural view of a top-gate oxide thin film transistor.

For example, FIG. 1 is a schematic structural view of a current top-gate oxide thin film transistor. The top-gate oxide thin film transistor comprises a substrate 1 and a buffer layer 2, an active layer 3, a gate insulator layer 4, a gate metal layer 5, an insulator layer 6, and a source-drain electrode layer (comprising a drain electrode 7 and a source electrode 8) which are provided on the substrate 1 in sequence. After the etching process for the gate metal layer 5 and the gate insulator layer 4, a plasma treatment is performed with respect to the exposed active layer 3 and make more conductive the portion of the active layer 3, which portion is not overlapped with the gate metal layer 5 and the gate insulator layer 4. During the formation of the insulator layer 6, a conventional low temperature silicon oxide process (e.g., chemical vapor deposition) is performed to deposit a insulator layer film. However, the film quality of the insulator layer that is formed of the low temperature deposited insulator film is poor, and the further loss of oxygen elements is not effectively improved to the portion of the active layer 3 which is not overlapped with the gate metal layer 5 and the gate insulator layer 4 because of the low temperature (lower than 250° C.), thus the portion cannot be made conductive to a further degree.

Table 1 shows the data of the on-state current (Ion) and the off-state current (Ioff) of the top-gate oxide thin film transistor as illustrated in FIG. 1 in an example, which are measured when different voltages are applied across the drain electrode 7 and the source electrode 8. As can be seen from Table 1, the current when the top-gate thin film transistor as illustrated in FIG. 1 is in the on-state is small when different voltages are applied across the drain electrode 7 and the source electrode 8.

TABLE 1

| Vds | Ion | Ioff | Ion/Ioff |
| --- | --- | --- | --- |
| 0.1 | 1.1E−9 | 9.0E−15 | 1.2E+5 |
| 5.1 | 5.6E−8 | 4.0E−15 | 1.4E+7 |
| 10.1 | 1.1E−7 | 5.0E−15 | 2.3E+7 |
| 15.1 | 1.8E−7 | 1.0E−15 | 1.8E+8 |
| 20.1 | 2.7E−7 | 2.0E−15 | 1.4E+8 |

An embodiment of the present invention provides a top-gate oxide thin film transistor, and the top-gate oxide thin film transistor comprises: a substrate and an active layer, a gate insulator layer, a gate metal layer, an insulator layer, and a source-drain electrode layer which are formed on the substrate in sequence. A conductor is provided on a surface of a portion of the active layer, and the portion of the active layer is not overlapped with the gate metal layer in a direction perpendicular to the substrate, and the conductor is formed during the deposition of the insulator layer at a first temperature. The conductor is electrically connected to the source-drain electrode layer. During the manufacturing process of the top-gate oxide thin film transistor, depositing the insulator layer film at a high temperature can cause a further modification to the structure of the active layer, therefore increasing its conductivity and in turn further enhancing the electrical characteristics of the thin film transistor.

Figure 2:
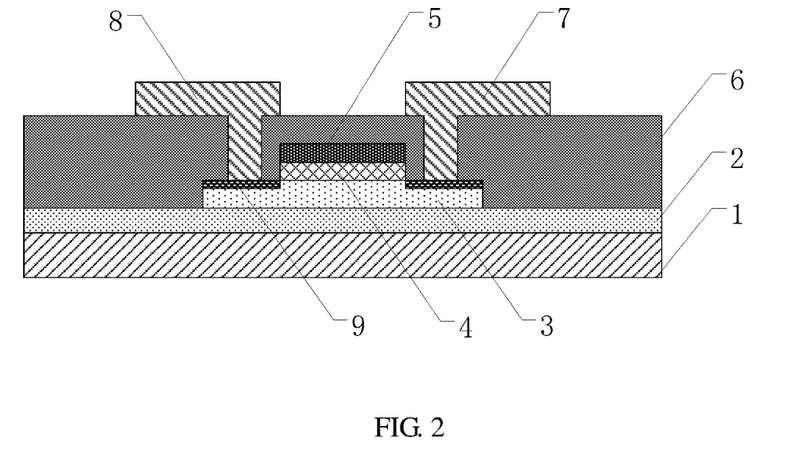
FIG. 2 is a schematic structural view of a top-gate oxide thin film transistor provided by an embodiment of the present invention.

An embodiment of the present invention provides a top-gate oxide thin film transistor, and FIG. 2 is a schematic structural view of a top-gate oxide thin film transistor provided by the embodiment of the present invention. For example, as illustrated in FIG. 2, the top-gate oxide thin film transistor comprises: a substrate 1 and an active layer 3, a gate insulator layer 4, a gate metal layer 5, an insulator layer 6, and a source-drain electrode layer (comprising a drain electrode 7 and a source electrode 8) which are provided on the substrate 1 in sequence. There are conductors 9 provided on the surfaces of the portion of the active layer 3, which portion is not overlapped with the gate metal layer 5 in a direction perpendicular to the substrate 1, and the conductors 9 are formed during the deposition of the insulator layer 6 at a first temperature. The conductors 9 are electrically connected to the source-drain electrode layer 9 (comprising the drain electrode 7 and the source electrode 8). For example, the insulator layer 6 is deposited at the first temperature (not shown) to make the portion of the active layer 3 conductive.

The active layer 3 is made of an oxide semiconductor material, and the portion (comprising a source region and a drain region) of the active layer 3, which portion is not overlapped with the gate metal layer 5, can be made conductive through a process such as a plasma treatment to enhance its conductivity and therefore to reduce its ohmic contact resistance generated in contact with a metal conductive film, for example. During the formation of the insulator layer 6, a high temperature deposition process is employed to form the insulator layer film, and thus the top-gate oxide thin film transistor is in a vacuum state at a high-temperature. Therefore, the portion of the active layer 3 that is not overlapped with the gate metal layer 5 (i.e., the portion that is made conductive) further loses oxygen elements to render the conductivity of the portion that has been made conductive further increased, so that the electrical characteristics of the thin film transistor is improved. When the insulator layer film is deposited at a temperature higher than 350° C., a plasma treatment is even not needed to obtain the technical effect by making the portion of the active layer conductive, for example, increasing the on-state current and reducing the off-state current.

Table 2 shows the data of the on-state current (Ion) and the off-state current (Ioff) of the top-gate oxide thin film transistor as illustrated in FIG. 2 in an example, which are measured when different voltages are applied across the drain electrode 7 and the source electrode 8.

TABLE 2

| Vds | Ion | Ioff | Ion/Ioff |
|---|---|---|---|
| 0.1 | 5.9E−7 | 4.0E−16 | 1.5E+09 |
| 5.1 | 2.8E−5 | 4.0E−16 | 7.1E+10 |
| 10.1 | 5.4E−5 | 1.2E−15 | 4.5E+10 |
| 15.1 | 8.0E−5 | 4.0E−16 | 2.0E+11 |

Compared with the data of the top-gate oxide thin film transistor as illustrated in FIG. 1, the data of the top-gate oxide thin film transistor as illustrated in FIG. 2 have increased on-state currents and reduced off-state currents. For example, when the voltage is 5.1V, the top-gate oxide thin film transistor as illustrated in FIG. 2 has an on-state current of 2.8E-5 A and an off-state current of 4.0E-15 A while the top-gate oxide thin film transistor as illustrated in FIG. 1 has an on-state current of 5.6E-8 A and an off-state current of 4.0E-16 A. So it can be concluded that the on-state current of the top-gate oxide thin film transistor as illustrated in FIG. 2 is 500 times as big as that of the top-gate oxide thin film transistor as illustrated in FIG. 1, and the off-state current of the top-gate oxide thin film transistor as illustrated in FIG. 2 is one-tenth of that of the top-gate oxide thin film transistor as illustrated in FIG. 1. Compared with the top-gate oxide thin film transistor as illustrated in FIG. 1, the on-state current of the top-gate oxide thin film transistor provided by the embodiment of the present invention is obviously increased and the off-state current is significantly decreased.

For example, during the formation of the insulator layer 6, the first temperature for depositing the insulator layer film is 290° C. or above. For example, the first temperature is in the range of 290° C.-400° C., for example, 290° C., 300° C., 350° C. or 400° C. The first temperature is higher than the temperature applied for depositing a insulator layer film in manufacturing the top-gate oxide thin film transistor as illustrated in FIG. 1, and the process is a high-temperature process. During the deposition of the insulator layer film (e.g., silicon oxide film or silicon nitride film) at the first temperature, the portion of the active layer 3 which is not overlapped with the gate metal layer 5 loses oxygen elements, and this portion that has been made conductive becomes conductive to a further degree so as to form a thin film transistor having electrical characteristics that meet requirements.

For example, the active layer 3 is processed by a plasma treatment to form a conductor(s) 9.

For example, after successively forming the active layer 3, the gate insulator layer 4 and the gate metal layer 5 on the substrate 1, a surface of the active layer 3 is subjected to plasma bombardment to modify the surface structure of the portion of the active layer that is not overlapped with the gate metal layer 5, so as to increase its conductivity to form a conductor(s) 9 (i.e., the portion of the active layer 3 that is made conductive). During the deposition of the insulator layer film at a high temperature, the top-gate oxide thin film transistor is in a vacuum state at the high-temperature and the conductor(s) 9 further loses oxygen elements so as to have stronger and more stable conductivity. Therefore, the electrical characteristics of the thin film transistor are improved.

During a plasma treatment with respect to the portion of the active layer 3 that is not overlapped with the gate metal layer 5, for example, a radio-frequency tube with a power of 10 W-5000 W can be used to generate plasma, and the duration of the plasma treatment can be 30 seconds to 30 minutes.

For example, the gas for generating plasma includes protective atmosphere gas or reactive atmosphere gas. For example, the protective atmosphere gas may comprise one of nitrogen, argon, helium or neon or any combination of these gases. The protective atmosphere gas may comprise one of air, oxygen, hydrogen, ammonia, or carbon dioxide or any combination of these gases.

For example, the material of the active layer 3 includes a metal oxide material such as indium gallium zinc oxide (IGZO), indium zinc oxide (IZO), zinc oxide (ZnO), gallium zinc oxide (GZO) or the like. The active layer 3 can be first deposited through magnetron sputtering and then formed by a patterning process. The active layer 3 can have a thickness of 30-50 nm, for example, 30 nm, 40 nm or 50 nm.

For example, the material of the gate metal layer 5 may include copper-based metal materials, such as copper (Cu), copper-molybdenum alloy (Cu/Mo), copper-molybdenum-titanium alloy (Cu/Mo/Ti), copper-molybdenum-tungsten alloy (Cu/Mo/W), and copper-molybdenum-niobium alloy (Cu/Mo/Nb), or the like. The material of the gate metal layer 5 may also include chromium-based metal material, such as chromium-molybdenum alloy (Cr/Mo), chromium-titanium alloy (Cr/Ti), chromium-molybdenum-titanium alloy (Cr/Mo/Ti), or the like.

For example, the material used for the gate insulator layer 4 includes silicon nitride (SiNx), silicon oxide (SiOx), aluminum oxide ($Al_2O_3$), aluminum nitride (AlN) or other proper materials.

For example, the top-gate oxide thin film transistor may further comprise a buffer layer 2 between the substrate 1 and the active layer 3. The buffer layer 2 functions as a transition layer between the substrate 1 and the active layer 3 to make the combination of the substrate 1 and the active layer 3 more stable, and further to prevent harmful impurities or ions of the substrate 1 from diffusing into the active layer 3.

For example, the material of the buffer layer 2 includes silicon oxide (SiOx) or silicon nitride (SiNx). For example, the buffer layer 2 may be of a single layer structure formed of silicon oxide (SiOx) or silicon nitride (SiNx), or of a bilayer structure formed of silicon oxide (SiOx) and silicon nitride (SiNx).

An embodiment of the present invention further provides an array substrate, and FIG. 3 is a schematic structural view of an array substrate provided by an embodiment of the present invention. For example, as illustrated in FIG. 3, the array substrate comprises the top-gate oxide thin film transistor provided by the first embodiment. For example, the array substrate illustrated in FIG. 3 further comprises a pixel electrode 12, a second insulator layer 13 and a passivation layer 14.

For example, the pixel electrode 12 is electrically connected to, for example, the drain electrode 7 of the thin film transistor, through a via hole formed in the second insulator layer 13 and the passivation layer 14. The source electrode 8 of the thin film transistor is electrically connected to the data line (not shown) or is formed to be integrated with the data line. The gate metal layer 5 of the thin film transistor is electrically connected to the gate line (not shown) or is formed to be integrated with the gate line. Usually, data lines and gate lines intersect with each other and define sub-pixels in the array substrate, and the thin film transistor functions as a switch device of a sub-pixel.

For example, the pixel electrode 12 is made of a transparent conductive material or a metal material. For example, the material for forming the pixel electrode 12 include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotube (CNT), or the like.

For example, the material of the passivation layer 14 may be silicon oxide (SiOx), silicon nitride (SiNx), acrylic resin, or the like.

For example, the material of the second insulator layer 13 may be an organic insulating material or an inorganic insulating material or of a stack structure formed by an organic insulating materials and an inorganic insulating material. For example, the material for forming the second insulator layer 13 may be silicon oxide (SiOx), silicon nitride (SiNx), acrylic resin or the like.

For example, the array substrate may be applied in a liquid crystal display panel, an organic light emitting diode display panel or an e-paper display panel.

An embodiment of the present disclosure further provides a display device comprising any one array substrate described above.

For example, an example of the display device is a liquid crystal display device, an array substrate and an opposing substrate are opposed to each other to form a liquid crystal cell, and the liquid crystal cell is filled with liquid crystal. The opposing substrate can be a color filter substrate for example. The pixel electrode of each sub-pixel is employed to apply an electric field to control the rotation degree of the liquid crystal material to conduct display. In some examples, the liquid crystal display device comprises a backlight as a light source to provide back light for the array substrate.

Another example of the display device is an organic light emitting diode display (OLED), a stack of organic light-emitting materials are formed on the array substrate, and the pixel electrode of each pixel unit functions as an anode or a cathode to drive the organic light-emitting materials to emit light to conduct display.

Another example of the display device is an e-paper display, an e-ink layer is formed on the array substrate, and the pixel electrode of each pixel unit is employed to apply a voltage for moving the electric particles in the e-ink to conduct display.

Figure 4:
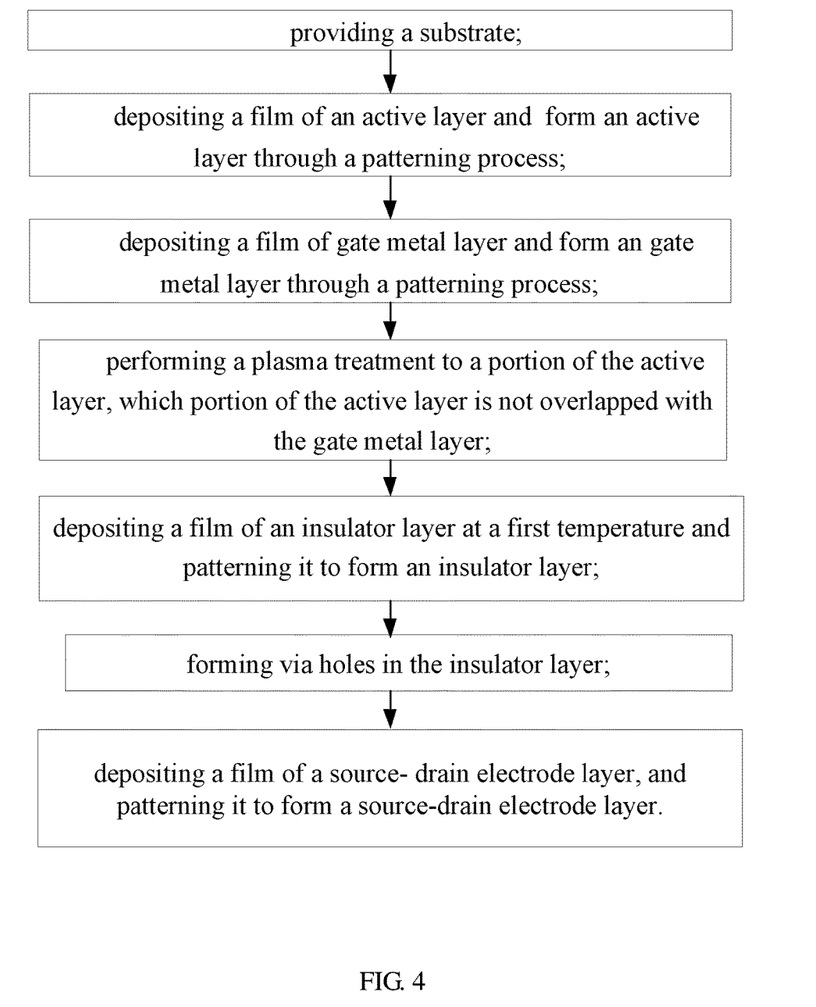
FIG. 4 is a flowchart of a manufacturing method of top-gate thin film transistor provided by an embodiment of the present invention.

An embodiment of the present invention further provides a manufacturing method of a top-gate oxide thin film transistor. For example, FIG. 4 is a flowchart of a manufacturing method of top-gate thin film transistor provided by an embodiment of the present invention. For example, the process of manufacturing the top-gate oxide thin film transistor comprises: providing a substrate; depositing an active layer film, a gate insulator layer film, and a gate metal layer film on the substrate in sequence, and pattern the active layer film, the gate insulator layer film, and the gate metal layer film to form an active layer, a gate insulator layer and a gate metal layer respectively; and depositing an insulator layer film at a first temperature and pattern the insulator layer film to form an insulator layer; the portion of the active layer is treated to become conductive to provide a conductor during the deposition of the insulator layer film, which portion of the active layer is not overlapped with the gate metal layer.

For example, the process of manufacturing the top-gate oxide thin film transistor further comprises performing a plasma treatment to the portion of the active layer, which portion of the active layer is not overlapped with the gate metal layer.

For example, the process of manufacturing a top-gate oxide thin film transistor further comprises depositing a source-drain electrode layer film on the insulator layer film, and patterning the source-drain electrode layer film to form a source-drain electrode layer.

For example, the process of manufacturing a top-gate oxide thin film transistor further comprises forming via holes in the insulator layer and the portion of the active layer is electrically connected with the source-drain electrode layer through via holes, which portion of the active layer has been treated to become conductive.

For example, the process of manufacturing a top-gate oxide thin film transistor further comprises forming a buffer layer between the substrate and the active layer.

FIGS. 5*a* to 5*h* are schematic structural views illustrating a manufacturing method of a top-gate thin film transistor provided by an embodiment of the present invention. With reference to FIGS. 5*a* to 5*h*, one example of the process of manufacturing the top-gate oxide thin film transistor provided by an embodiment of the present invention comprises steps as following.

Figure 5A:
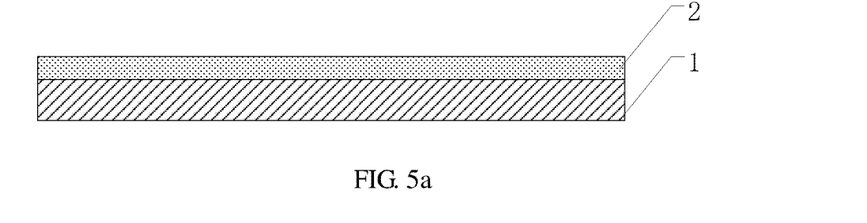
FIGS. 5a to 5h are schematic structural views illustrating a manufacturing method of a top-gate thin film transistor provided by an embodiment of the present invention.

As illustrated in FIG. 5*a*, a substrate 1 is provided and a buffer layer 2 is formed on the substrate. For example, the substrate 1 may be a glass substrate. For example, the material of the buffer layer 2 includes silicon oxide (SiOx), silicon nitride (SiNx) or silicon nitrogen oxide (SiOxNy). For example, the buffer layer 2 may be of a single layer structure formed of silicon oxide (SiOx) or silicon nitride (SiNx), or of a bilayer structure formed of silicon oxide (SiOx) and silicon nitride (SiNx).

Figure 5B:
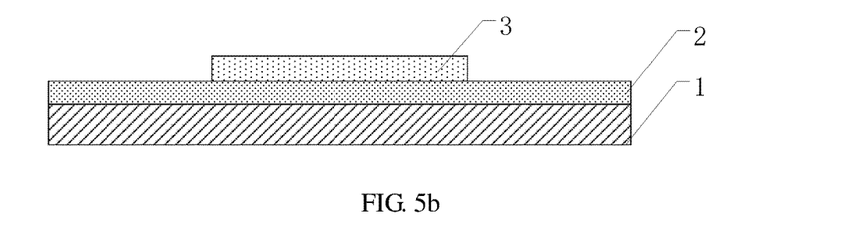

As illustrated in FIG. 5*b*, an active layer film is deposited on the buffer layer 2 and the active layer film is patterned to form an active layer 3. For example, the material of the active layer 3 is a metal oxide material such as indium gallium zinc oxide (IGZO), indium zinc oxide (IZO), zinc oxide (ZnO), gallium zinc oxide (GZO), or the like. The active layer 3 may be deposited through magnetron sputtering and then formed through a patterning process. The active layer 3 may have a thickness of 30-50 nm, for example, 30 nm, 40 nm or 50 nm.

In an embodiment provided by the present invention, the patterning process may be a photolithography process for example, and can comprise for example: coating the structure layer for patterning with a layer of photoresist, exposing the layer of photoresist with a mask, developing the exposed layer of photoresist to form a pattern of photoresist, using the pattern of photoresist to etch the structure, and removing the pattern of photoresist selectively. According to the need, the patterning process may also be screen printing, ink-jet printing, or the like.

Figure 5C:
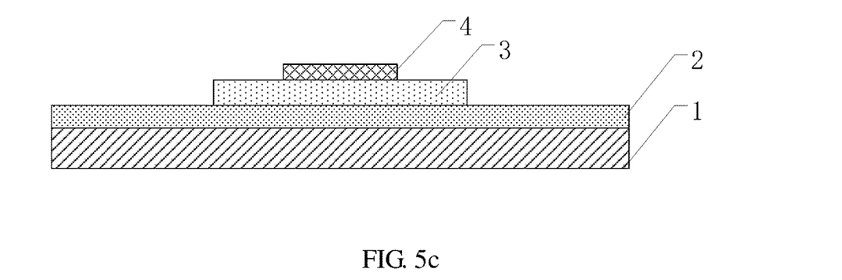

As illustrated in FIG. 5c, a gate insulator layer film is deposited on the active layer 3 and the gate insulator layer film is patterned to form an insulator layer 4. For example, the material for forming the gate insulator layer 4 includes silicon nitride (SiNx), silicon oxide (SiOx), aluminum oxide ($Al_2O_3$), aluminum nitride (AlN) or other proper material.

Figure 5D:
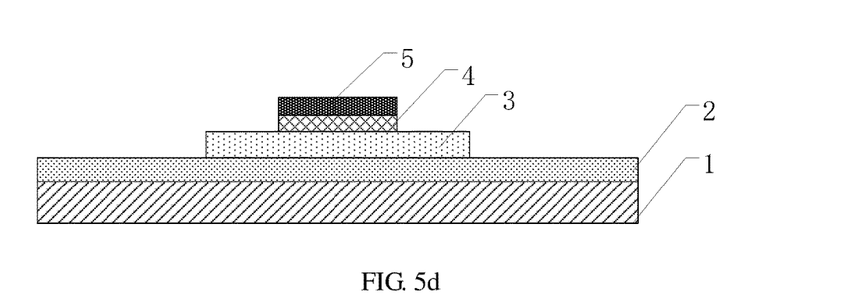

As illustrated in FIG. 5d, a gate metal layer film is deposited on the insulator layer 4, and the gate metal layer film is patterned to form the gate metal layer 5. For example, the gate metal layer 5 is overlapped with the insulator layer 4. For example, the material of the gate metal layer 5 can be a copper-based metal material, such as copper (Cu), copper-molybdenum alloy (Cu/Mo), copper-molybdenum-titanium alloy (Cu/Mo/Ti), copper-molybdenum-tungsten alloy (Cu/Mo/W), copper-molybdenum-niobium alloy (Cu/Mo/Nb), or the like. The material of the gate metal layer 5 can also be a chromium-based metal material, such as chromium-molybdenum alloy (Cr/Mo), chromium-titanium alloy (Cr/Ti), chromium-molybdenum-titanium alloy (Cr/Mo/Ti), or the like.

Figure 5E:
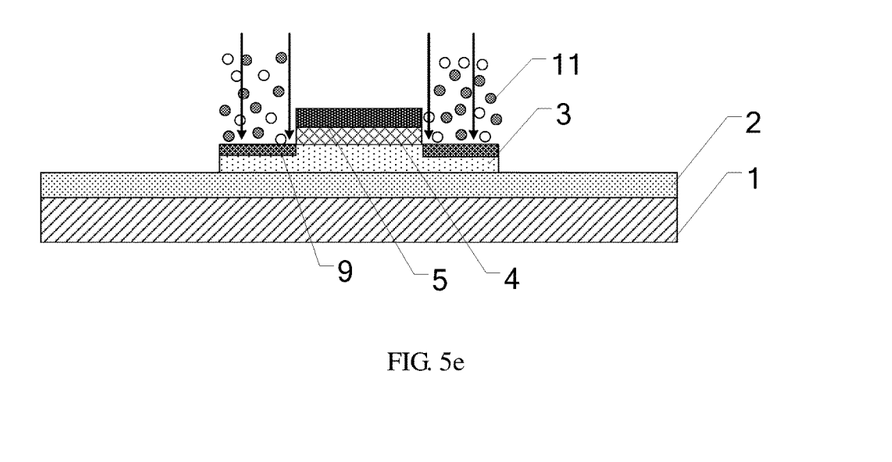

As illustrated in FIG. 5e, a portion of the active layer 3 is subjected to plasma bombardment, which portion of the active layer 3 is not overlapped with the gate metal layer 5. During the plasma bombardment to the active layer 3, the surface structure of the portion of the active layer 3, which is not overlapped with the gate metal layer 5, is modified and the conductivity of this portion is enhanced, so as to form the portion 9 of the active layer 3, which portion of the active layer 3 is made conductive. For example, the gas for generating plasma includes a protective atmosphere gas or a reactive atmosphere gas. For example, the protective atmosphere gas may comprise one of nitrogen, argon, helium and neon, or any combination of these gases. The protective atmosphere gas may comprise one of air, oxygen, hydrogen, ammonia and carbon dioxide, or any combination of these gases.

Figure 5F:
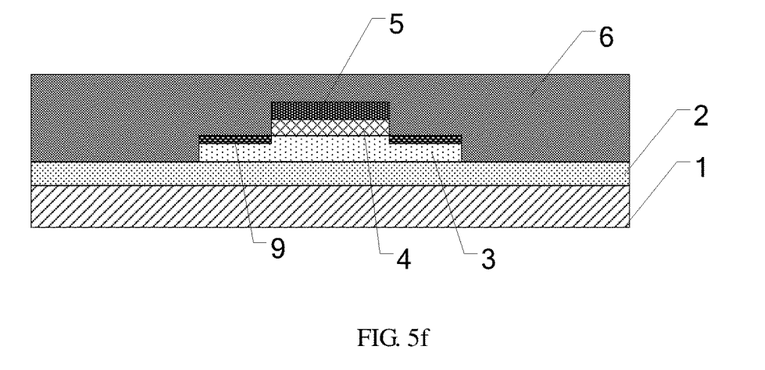

As illustrated in FIG. 5f, an insulator layer film is deposited on the buffer layer 2 at a first temperature. During the deposition of the insulator layer film (e.g., silicon nitride film or silicon oxide film), the portion of the active layer 3 not overlapped with the gate metal layer 5 loses oxygen elements to a further degree, that is to say, the portion 9 that has been made conductive becomes conductive to a further degree, so as to form a thin film transistor, of which the electrical characteristic meets requirements. For example, the first temperature for depositing the insulator layer is 290° C. or above. Furthermore, the first temperature for depositing the insulator layer is in a range of 290° C.-400° C., for example, 290° C., 300° C., 350° C. or 400° C. For example, the material of the insulator layer 6 includes silicon nitride (SiNx) or silicon oxide (SiOx).

Figure 5G:
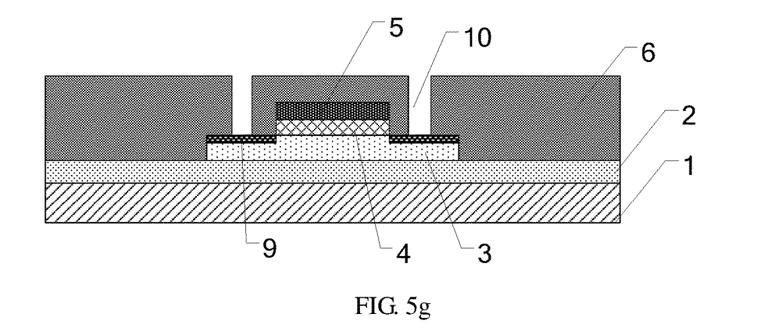

As illustrated in FIG. 5g, via hole(s) 10 is formed in the insulator layer. For example, the via hole(s) 10 is connected to the conductor(s) 9. That is to say, the conductor(s) 9 are exposed.

Figure 5H:
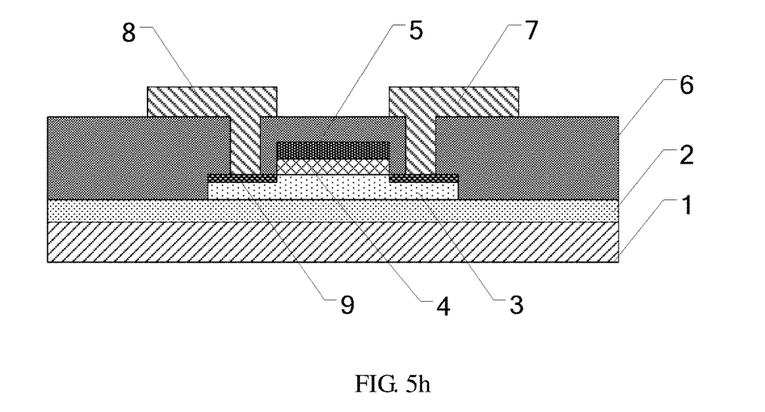

As illustrated in FIG. 5h, a source-drain electrode layer film is formed is formed on the insulator layer 6, and the source-drain electrode layer film is patterned to form a source-drain electrode layer (comprising a drain electrode 7 and a source electrode 8).

For example, the source-drain electrode layer is electrically connected to the conductor(s) 9 through the via hole(s) 10 (see FIG. 5g).

In another example of the present invention, the process of forming the gate insulator layer 4 as illustrated in FIG. 5c and the process of forming the gate metal layer 5 as illustrated in FIG. 5e can be merged. That is to say, the gate insulator layer film and the gate metal layer film are formed successively and the gate insulator layer 4 and the gate metal layer 5 are formed through same one patterning process.

Embodiments of the present invention provide a thin film transistor and a manufacturing method thereof, an array substrate and a display device, and have at least one of advantages as followings:

(1) Good film quality of the insulator layer that can be realized due to a high temperature (i.e., the first temperature) applied during the deposition of the insulator layer film;

(2) Significant improvement in the electrical characteristic of the thin film transistor that can be due to the conductor(s) formed on the active layer.

As for the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or area may be enlarged or narrowed, that is, the drawings are not drawn in a real scale.

(3) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

The application claims priority to the Chinese patent application No. 201610798600.6, filed Aug. 31, 2016, the entire disclosure of which is incorporated herein by reference as part of the present application.

What is claimed is:

1. A manufacturing method of an oxide thin film transistor, comprising:

providing a substrate;

depositing an active layer film, a gate insulator layer film, and a gate metal layer film on the substrate in sequence, and patterning the active layer film, the gate insulator layer film, and the gate metal layer film to form an active layer, a gate insulator layer and a gate metal layer respectively; and depositing an insulator layer film at a first temperature and patterning the insulator layer film to form an insulator layer;

wherein a portion of the active layer, which portion is not overlapped with the gate metal layer, is treated to become conductive to provide a conductor during deposition of the insulator layer film.

2. The manufacturing method according to claim 1, further comprising:
depositing a source-drain electrode layer film, and patterning the source-drain electrode layer film to form a source-drain electrode layer.

3. The manufacturing method according to claim 2, further comprising:
forming via holes in the insulator layer, wherein the portion of the active layer, which portion has been made conductive, is electrically connected with the source-drain electrode layer through the via holes.

4. The manufacturing method according to claim 1, further comprising:
forming a buffer layer between the substrate and the active layer.

5. The manufacturing method according to claim 1, wherein a material of the active layer includes indium gallium zinc oxide (IGZO), indium zinc oxide (IZO), zinc oxide (ZnO) or gallium zinc oxide (GZO).

6. The manufacturing method according to claim 5, wherein the first temperature is 290° C. or above.

7. The manufacturing method according to claim 6, wherein the first temperature is in a range of 290° C.-400° C.

8. The manufacturing method according to claim 1, further comprising: performing a plasma treatment to the portion of the active layer, which portion of the active layer is not overlapped with the gate metal layer.

9. A thin film transistor, comprising:
a substrate;
an active layer, a gate insulator layer, a gate metal layer, an insulator layer, and a source-drain electrode layer provided on the substrate in sequence;
wherein a conductor is provided on a surface of a portion of the active layer, which portion of the active layer is not overlapped with the gate metal layer in a direction perpendicular to the substrate, and the conductor is formed during deposition of the insulator layer at a first temperature, and the conductor is electrically connected to the source-drain electrode layer.

10. The thin film transistor according to claim 9, wherein the first temperature is 290° C. or above.

11. The thin film transistor according to claim 10, wherein the first temperature is in a range of 290° C.-400° C.

12. The thin film transistor according to claim 9, wherein the conductor is formed by plasma treatment.

13. The thin film transistor according to claim 12, wherein a gas for generating plasma includes nitrogen, argon or helium.

14. The thin film transistor according to claim 9, wherein a material of the active layer includes indium gallium zinc oxide (IGZO), indium zinc oxide (IZO), zinc oxide (ZnO) and gallium zinc oxide (GZO).

15. The thin film transistor according to claim 14, further comprising a buffer layer between the substrate and the active layer.

16. The thin film transistor according to claim 15, wherein a material of the buffer layer includes silicon oxide or silicon nitride.

17. An array substrate comprising the thin film transistor according to claim 9.

18. A display device comprising the array substrate according to claim 17.

* * * * *